United States Patent
Jacob et al.

(10) Patent No.: US 9,425,289 B2
(45) Date of Patent: Aug. 23, 2016

(54) METHODS OF FORMING ALTERNATIVE CHANNEL MATERIALS ON FINFET SEMICONDUCTOR DEVICES

(71) Applicant: GLOBALFOUNDRIES Inc., Grand Cayman (KY)

(72) Inventors: Ajey Poovannummoottil Jacob, Watervliet, NY (US); Murat Kerem Akarvardar, Saratoga Springs, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/471,038

(22) Filed: Aug. 28, 2014

(65) Prior Publication Data

US 2016/0064526 A1  Mar. 3, 2016

(51) Int. Cl.
- *H01L 21/20* (2006.01)
- *H01L 29/66* (2006.01)
- *H01L 21/306* (2006.01)
- *H01L 21/02* (2006.01)

(52) U.S. Cl.
CPC .... *H01L 29/66795* (2013.01); *H01L 21/30604* (2013.01); *H01L 21/02532* (2013.01); *H01L 21/02664* (2013.01)

(58) Field of Classification Search
CPC ............. H01L 2924/00; H01L 2924/00014; H01L 2224/16225; H01L 2224/32225; H01L 2924/181; H01L 2924/12042; H01L 2924/15311; H01L 2224/73204; H01L 2224/13147; H01L 2224/48227; H01L 2224/73265

See application file for complete search history.

(56) References Cited

U.S. PATENT DOCUMENTS

| | | |
|---|---|---|
| 2007/0235802 A1 | 10/2007 | Chong et al. |
| 2013/0234217 A1 | 9/2013 | Lin et al. |
| 2014/0011341 A1* | 1/2014 | Maszara ........... H01L 29/66795 438/478 |
| 2015/0021696 A1 | 1/2015 | Sung et al. |

OTHER PUBLICATIONS

Balakumar et al., "Fabrication of Thick Germanium-on-Insulator (GeOI) Substrates," Journal of Electronic Materials, 37:944-950, 2008.
Office Action from related U.S. Appl. No. 14/525,351 dated Oct. 22, 2015.
Final Office Action from related U.S. Appl. No. 14/525,351 dated Mar. 29, 2016.

* cited by examiner

*Primary Examiner* — Robert Bachner
(74) *Attorney, Agent, or Firm* — Amerson Law Firm, PLLC

(57) ABSTRACT

One illustrative method disclosed herein includes forming a recessed fin structure and a replacement fin cavity in a layer of insulating material above the recessed fin structure, forming at least first and second individual layers of epi semiconductor material in the replacement fin cavity, wherein each of the first and second layers have different concentrations of germanium, performing an anneal process on the first and second layers so as to form a substantially homogeneous SiGe replacement fin in the fin cavity, and forming a gate structure around at least a portion of the replacement fin.

25 Claims, 5 Drawing Sheets

US 9,425,289 B2

METHODS OF FORMING ALTERNATIVE CHANNEL MATERIALS ON FINFET SEMICONDUCTOR DEVICES

BACKGROUND OF THE INVENTION

1. Field of the Invention

Generally, the present disclosure relates to the manufacture of semiconductor devices, and, more specifically, to various methods of forming alternative channel materials on FinFET semiconductor devices.

2. Description of the Related Art

The fabrication of advanced integrated circuits, such as CPU's, storage devices, ASIC's (application specific integrated circuits) and the like, requires the formation of a large number of so-called metal oxide field effect transistors (MOSFETs or FETs). A transistor includes a source region, a drain region, a channel region that is positioned between the source region and the drain region, and a gate electrode positioned above the channel region that is separated therefrom by a gate insulation layer. Current flow between the source and drain regions of the FET device controlled by controlling the voltage applied to the gate electrode. For example, for an NMOS device, if there is no voltage applied to the gate electrode, then there is no current flow through the NMOS device (ignoring undesirable leakage currents, which are relatively small). However, when an appropriate positive voltage is applied to the gate electrode, the channel region of the NMOS device becomes conductive, and electrical current is permitted to flow between the source region and the drain region through the conductive channel region.

Transistors come in a variety of configurations. A conventional FET is a planar device, wherein the transistor is formed in and above an active region having a substantially planar upper surface. In contrast to a planar FET, there are so-called 3D devices, such as an illustrative FinFET device, which is a three-dimensional structure. FIG. 1 is a perspective view of an illustrative prior art FinFET semiconductor device 10 that is formed above a semiconductor substrate 12. The device 10 includes three illustrative fins 14, a gate structure 16, sidewall spacers 18 and a gate cap layer 20. The gate structure 16 is typically comprised of a layer of insulating material (not separately shown), e.g., a layer of high-k insulating material, and one or more conductive material layers that serve as the gate electrode for the device 10. In this example, the fins 14 are comprised of a substrate fin portion 14A and an alternative fin material portion 14B. The substrate fin portion 14A may be made of silicon, i.e., the same material as the substrate, and the alternative fin material portion 14B may be made of a material other than the substrate material, for example, silicon-germanium. The fins 14 have a three dimensional configuration: a height H, a width W and an axial length L. The axial length L corresponds to the direction of current travel in the device 10 when it is operational. The portions of the fins 14 covered by the gate structure 16 are the channel regions of the FinFET device 10. In a conventional process flow, the portions of the fins 14 that are positioned outside of the spacers 18, i.e., in the source/drain regions of the device 10, may be increased in size or even merged together (not shown in FIG. 1) by performing one or more epitaxial growth processes. The process of increasing the size of or merging the fins 14 in the source/drain regions of the device 10 is performed to reduce the resistance of source/drain regions and/or make it easier to establish electrical contact to the source/drain regions.

Unlike a planar FET, in a FinFET device, a channel is formed perpendicular to a surface of the semiconducting substrate so as to increase the drive current per footprint of the device. Also, in a FinFET device, the improved gate control through multiple gates on a narrow, fully-depleted semiconductor fin significantly reduces undesirable short channel effects. When an appropriate voltage is applied to the gate electrode 16 of a FinFET device 10, the surfaces (and the inner portion near the surface) of the fins 14, i.e., the vertically oriented sidewalls and the top upper surface of the fin (for a tri-gate device), form a surface inversion layer or a volume inversion layer that contributes to current conduction.

Accordingly, for a given plot space (or foot-print), FinFETs tend to be able to generate significantly higher drive current than planar transistor devices. Additionally, the leakage current of FinFET devices after the device is turned "OFF" is significantly reduced as compared to the leakage current of planar FETs, due to the superior gate electrostatic control of the "fin" channel on FinFET devices. In short, the 3D structure of a FinFET device is a superior MOSFET structure as compared to that of a planar FET, especially in the 20 nm CMOS technology node and beyond.

As it relates to transistor devices, such as planar and 3D devices, device designers have spent many years and employed a variety of techniques in an effort to improve the performance, capability and reliability of such devices. As noted above, device designers are currently investigating using alternative semiconductor materials, such as so-called SiGe, Ge and III-V materials, to manufacture FinFET devices which are intended to enhance the performance capabilities of such devices, e.g., to enable low-voltage operation without degrading their operating speed.

However, the integration of such alternative materials on silicon substrates (the dominant substrates used in the industry) is non-trivial due to, among other issues, the large difference in lattice constants between such alternative materials and silicon. That is, with reference to FIG. 1, the lattice constant of the alternative fin material portion 14B of the fin 14 may be substantially greater than the lattice constant of the substrate fin portion 14A of the fin 14. As a result of this mismatch in lattice constants, an unacceptable number of defects may be formed or created in the alternative fin material portion 14B. As used herein, a "defect" essentially refers to a misfit dislocation at the interface between the portions 14A and 14B of the fin 14 or threading dislocations that propagate through the portion 14B on the fin 14 at well-defined angles corresponding to the (111) plane. What is needed is an efficient and cost-effective method of forming alternative channel materials on FinFET devices that produces substantially defect-free channel semiconductor material.

The present disclosure is directed to various methods of forming alternative channel materials on FinFET semiconductor devices that may solve or reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming alternative channel materials on FinFET semiconductor devices. One illustrative method disclosed herein includes, among other things, forming an initial fin structure in a semiconductor substrate, forming a layer of insulating material around the initial fin structure, performing a recess etching process to recess the initial fin structure and thereby define a recessed fin structure and a replacement fin cavity in the layer of insulating material above the recessed fin structure, forming at least first and second individual layers of epi semiconductor material in the replacement fin cavity, wherein each of the first and second layers have different concentrations of germanium, performing an anneal process on the first and second layers so as to form a substantially homogeneous SiGe replacement fin in the fin cavity, recessing the layer of insulating material so as to thereby expose at least an upper portion of the replacement fin, and forming a gate structure around at least a portion of the replacement fin exposed above the recessed layer of insulating material.

Another illustrative method involves, among other things, forming an initial fin structure in a silicon substrate, forming a layer of insulating material around the initial fin structure, performing a recess etching process to recess the initial fin structure and thereby define a recessed fin structure and a replacement fin cavity in the layer of insulating material above the recessed fin structure, forming at least first and second individual layers of epi SiGe semiconductor material in the replacement fin cavity, wherein each of the first and second layers have different concentrations of germanium, performing a mixing thermal anneal process at a temperature that falls within the range of 700-1100° C. on the first and second layers so as to form a substantially homogeneous SiGe replacement fin in the fin cavity, recessing the layer of insulating material so as to thereby expose at least an upper portion of the replacement fin, and forming a gate structure around at least a portion of the replacement fin exposed above the recessed layer of insulating material.

Yet another illustrative method disclosed herein includes, among other things, forming an initial fin structure in a silicon substrate, forming a layer of insulating material around the initial fin structure, performing a recess etching process to recess the initial fin structure and thereby define a recessed fin structure and a replacement fin cavity in the layer of insulating material above the recessed fin structure, forming at least first and second individual layers of epi SiGe semiconductor material in the replacement fin cavity, wherein each of the first and second layers have different concentrations of germanium, performing a condensation anneal process in an oxidizing process ambient at a temperature that falls within the range of 500-800° C. on the first and second layers so as to form a substantially homogeneous SiGe replacement fin in the fin cavity, recessing the layer of insulating material so as to thereby expose at least an upper portion of the replacement fin, and forming a gate structure around at least a portion of the replacement fin exposed above the recessed layer of insulating material.

BRIEF DESCRIPTION OF THE DRAWINGS

The disclosure may be understood by reference to the following description taken in conjunction with the accompanying drawings, in which like reference numerals identify like elements, and in which.

Figure 1:
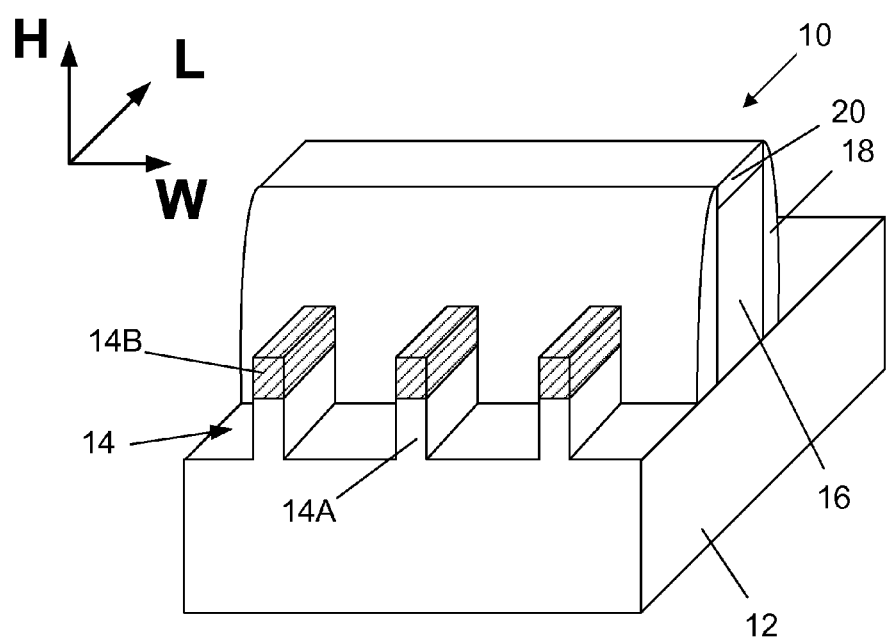
FIG. 1 depicts one example of a prior art FinFET device wherein the fins for the device are comprised of an alternative fin material formed above a substrate fin.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming alternative channel materials on FinFET semiconductor devices. In one embodiment, the illustrative device 100 will be formed in and above the semiconductor substrate 102 having a bulk configuration. The device 100 may be either an NMOS or a PMOS transistor. The substrate 102 may be made of silicon or it may be made of materials other than silicon. Thus, the terms "substrate" or "semiconductor substrate" should be understood to cover all semiconducting materials and all forms of such materials. Additionally, various doped regions, e.g., source/drain regions, halo implant regions, well regions and the like, are not depicted in the attached drawings. Of course, the inventions disclosed herein should not be considered to be limited to the illustrative examples depicted and described herein. The various components and structures of the device 100 disclosed herein may be formed using a variety of different materials and by performing a variety of known techniques, e.g., a chemical vapor deposition (CVD) process, an atomic layer deposition (ALD) process, a thermal growth process, epi growth processes, spin-coating techniques, etc. The thicknesses of these various layers of material may also vary depending upon the particular application.

One illustrative method of forming alternative channel materials for FinFET devices involves forming the initial fin structures in the substrate, forming a layer of insulating material around the fins, exposing the upper surface of the fins and then performing a timed recessing etching process to remove a portion of the fin, thereby producing a recessed fin structure. Thereafter, a single layer of alternative fin material, such as SiGe, is grown on the recessed fin structure by performing an epitaxial growth process. However, formation of such single layers of SiGe is limited as to the amount of germanium that may be incorporated in such single layers. Such single layers of SiGe are also prone to have a relatively high amount of defects and other non-uniformity issues. One way to attempt to eliminate or reduce the number of defects in such a single layer of SiGe material is to increase the number of thermal cycles or the temperature of the thermal cycles performed on the SiGe material in an effort to eliminate or reduce the number of defects in the single layer of SiGe material. Unfortunately, increasing the thermal budget for manufacturing such a device is not desirable as it produces many undesirable effects on other aspects of device fabrication that must be accounted for when manufacturing the device. The inventors have discovered a novel method of forming such alternative materials on FinFET semiconductor devices.

Figure 2A:
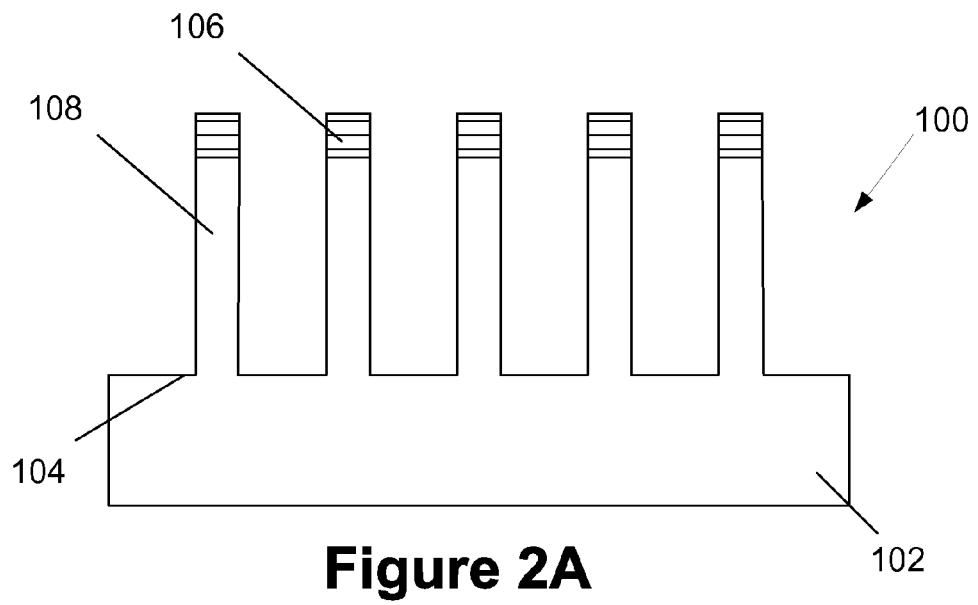
FIGS. 2A-2G depict various methods disclosed herein for forming alternative channel materials on FinFET semiconductor devices.

FIG. 2A depicts the device 100 after several process operations were performed. First, a patterned etch mask 106, e.g., a patterned layer of photoresist material or a patterned hard mask layer, was formed above the substrate 102. Thereafter, one or more etching processes were performed through the patterned etch mask to define a plurality of trenches 104 in the substrate 102. The formation of the trenches 104 defines a plurality of initial fins 108. In the depicted example, five illustrative fins 108 are shown. However, the methods disclosed herein may be employed to form a device 100 with any desired number of fins 108.

The overall size, shape and configuration of the fin-formation trenches 104 and fins 108 may vary depending on the particular application. In the illustrative examples depicted in the attached drawings, the fin-formation trenches 104 and fins 108 are all depicted as having a uniform size and shape. However, such uniformity in the size and shape of the fin-formation trenches 104 and the fins 108 is not required to practice at least some aspects of the inventions disclosed herein. In the attached figures, the fin-formation trenches 104 are depicted as having been formed by performing an anisotropic etching process that results in the fin-formation trenches 104 having a schematically depicted, generally rectangular configuration. In an actual real-world device, the sidewalls of the fin-formation trenches 104 may be somewhat inwardly tapered, although that configuration is not depicted in the attached drawings. Thus, the size and configuration of the fin-formation trenches 104, and the manner in which they are made, as well as the general configuration of the fins 108, should not be considered a limitation of the present invention. For ease of disclosure, only the substantially rectangular fin-formation trenches 104 and fins 108 will be depicted in the subsequent drawings.

Figure 2B:
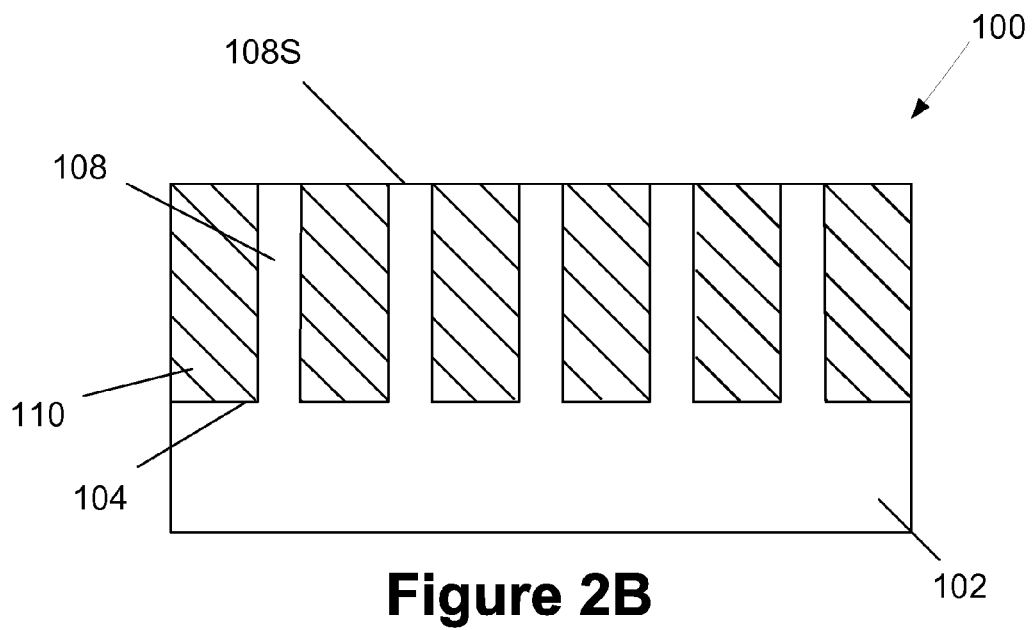

FIG. 2B depicts the device 100 after several process operations were performed. First, a layer of insulating material 110, such as silicon dioxide, was formed so as to overfill the trenches 104. Thereafter, one or more chemical mechanical polishing (CMP) processes were performed to planarize the upper surface of the insulating material 110 with the top of the fins 108. These process operations result in the removal of the patterned etch mask 106 and the exposure of the upper surface 108S of the fins 108.

Figure 2C:
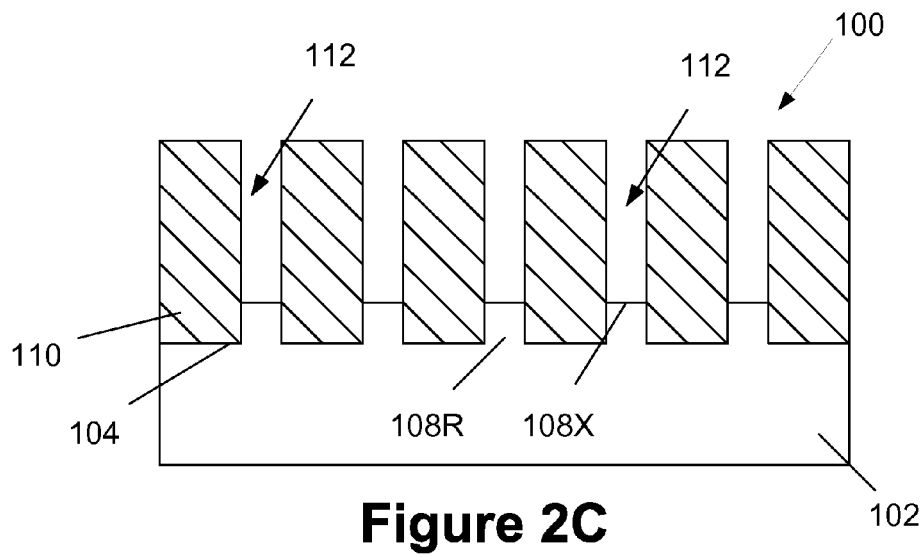

FIG. 2C depicts the device 100 after a timed recess etching process was performed to remove portions of the fins 108 and thereby define recessed fins 108R having a recessed upper surface 108X. The amount or extent of recessing of the initial fins 108 may vary depending upon the particular application. This process operation results in the formation of a plurality of replacement fin cavities 112 in the layer of insulating material 110 above the recessed fins 108R.

In general, the methods disclosed herein involve forming a final homogeneous SiGe semiconductor material in the fin cavities 112 that is substantially defect-free. In one embodiment, where a condensation anneal process (discussed below) is performed, the final homogeneous SiGe semiconductor material may have a high amount of germanium (which as used herein and in the claims shall mean a layer of SiGe with a germanium concentration of 50% or greater). As disclosed herein, this is accomplished by forming a plurality of layers of epi $Si_{(1-x)}Ge_{(x)}$ (where "x" ranges from 0-1) semiconductor material, wherein the germanium concentration in the layers of material varies and wherein the layers are each individually formed to a thickness such that they are substantially defect-free. Thereafter, a thermal mixing anneal process or a condensation anneal process is performed to produce the substantially defect-free final homogeneous SiGe semiconductor material in the fin cavities 112. The layers of epi material may also be doped with any additional material if desired, e.g., carbon, boron, an N-type dopant, a P-type dopant, etc. Such dopant material may be added by way of in situ doping or by ion implantation.

Figure 2D:
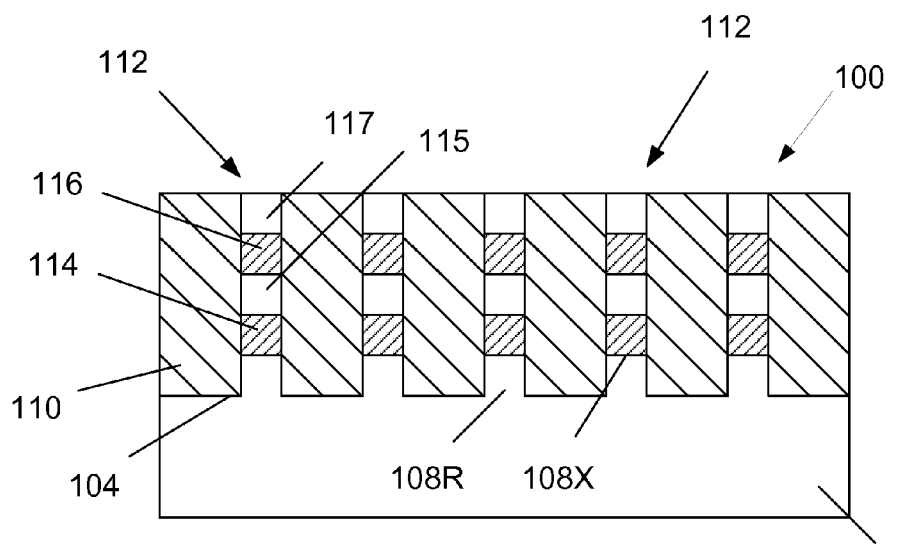

FIG. 2D depicts an illustrative example wherein four illustrative layers of epi semiconductor material $Si_{(1-x)}Ge_{(x)}$ 114, 115, 116 and 117 are sequentially formed in the fin cavities 112. As noted above, the germanium concentration in each of the layers of material 114, 115, 116 and 117 may be different, and they may be made of substantially pure silicon (Ge=0%), substantially pure germanium (Ge=100%) or an SiGe material that contains a combination of silicon and germanium $Si_{(1-x)}Ge_{(x)}$ (where "x" is greater than zero but less than 1). In some cases, two or more of the layers 114, 115, 116 and 117, e.g., the layers 114 and 116, may be selected to be an SiGe material having the same composition, while the layers 115 and 117 may be substantially pure silicon. In other cases, the layers 115 and 117 may be substantially pure germanium. The layers 114, 115, 116 and 117 are initially formed to a thickness such that each of the individual layers is substantially defect-free. Note that, since the layers 114, 115, 116 and 117 are formed in the restrictive fin cavities 112, the critical thickness of the materials may be greater than it would be were the layers 114, 115, 116 and 117 formed above a surface of a substrate in an unconfined situation. Although four illustrative epi layers are depicted (114, 115, 116 and 117), any number of layers of epi material may be formed in the fin cavities 112. In some applications, only two layers may be formed so as to substantially fill the fin cavities 112. Ultimately, the goal is to form a sufficient number of substantially defect-free epi layers having the desired amount of germanium—when all of the layers are considered collectively for the device under consideration—such that, after the thermal mixing anneal process or condensation anneal process mentioned above is performed, a final, substantially defect-free, homogeneous SiGe semiconductor material with the desired germanium concentration is formed in the fin cavities 112.

More specifically, in one particular embodiment, the first epi semiconductor layer 114 is a layer of epi SiGe material that was formed on the recessed fin 108R in the fin cavity 112; the second epi semiconductor layer 115 is a layer of epi silicon that was formed on the first epi semiconductor layer 114; the third epi semiconductor layer 116 is a layer of epi SiGe material that was formed on the second epi semiconductor layer 115; and the fourth epi semiconductor layer 117 is a layer of epi silicon that was formed on the third epi semiconductor layer 116. The alternating layers may be formed in any desired order, e.g., the silicon layers may be formed before the SiGe layers are formed. Moreover, the number of layers of different types of material, e.g., SiGe, Si, need not be the same in the fin cavities 112. For example, in the example depicted in FIG. 2D, the second layer of epi silicon 115 may be omitted. In some cases, the layers of material depicted in FIG. 2D need not be formed in a sequentially interleaved fashion. That is, with reference to FIG. 2D, the epi silicon layer 115 may be omitted such that the epi SiGe layer 116 is formed on the epi SiGe layer 114. In other cases, all of the layers 114, 115, 116 and 117 may be layers of epi SiGe material with different levels of germanium. Additionally, in the example depicted in FIG. 2D, the layers 114, 115, 116 and 117 are depicted as each being formed to substantially the same thickness. However, if desired the various layers 114, 115, 116 and 117 may all be formed to different thicknesses. In yet another embodiment, all or some of the various layers 114, 115, 116 and 117 are formed to a thickness that is less than the critical thickness for such material.

Figure 2E:
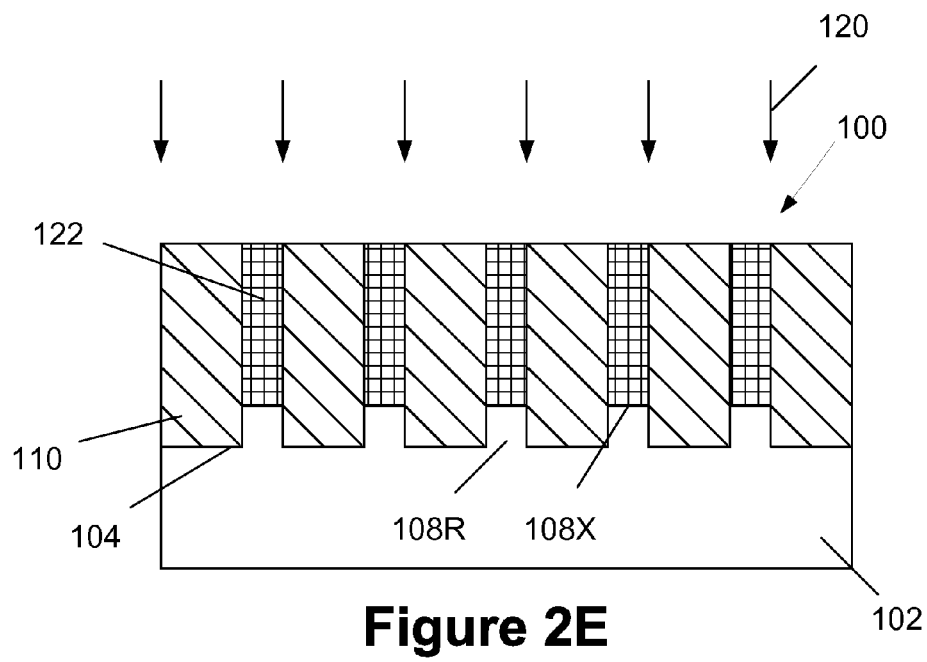

FIG. 2E depicts the device after a process operation 120 was performed on the device 100 so as to cause the formation of a substantially defect-free, substantially homogeneous SiGe semiconductor material 122 with the desired germanium concentration in the fin cavities 112. The process operation 120 may be a mixing thermal anneal process or a condensation anneal process.

The mixing thermal anneal process causes the germanium material to migrate from and among the various layers of epi semiconductor material 114, 115, 116 and 117 to thereby form the homogeneous SiGe semiconductor material 122. In one illustrative embodiment, the mixing thermal anneal process may be performed at a temperature that falls within the range of about 700-1100° C. using an RTA furnace, a laser anneal process or a traditional furnace, depending upon the particular application. In general, the longer the duration of the mixing thermal anneal process, the more complete will be the mixing of the germanium (and other dopant materials) from the layers 114, 115, 116 and 117, and the lower may be the temperature used in the mixing thermal anneal process. Conversely, the shorter the duration of the mixing thermal anneal process, the less complete will be the mixing of the germanium (and dopant materials) from the layers 114, 115, 116 and 117, and the higher may be the temperature used in the mixing thermal anneal process.

As noted above, at a high level, the methods disclosed herein involve establishing a target value for the germanium content in the homogeneous SiGe semiconductor material 122 for the device 100. Thereafter, the germanium concentration (and dopant concentrations if applicable) and thickness of each of the multiple layers of the epi semiconductor material layers, e.g., the layers 114, 115, 116 and 117, are engineered and selected such that, after the mixing thermal anneal process is performed, the resulting homogeneous SiGe semiconductor material 122 will have the target or desired high level of germanium (and dopant material if involved). For example, in the case where only two of the layers are formed with different germanium concentrations, the germanium concentration in the homogeneous SiGe semiconductor material 122 will be somewhere between the different germanium concentration in the first and second layers. The exact concentration of germanium in the final homogeneous SiGe semiconductor material 122 will depend upon, among other things, the germanium concentration and the thickness of each of the first and second layers. The multiple layers of epi semiconductor material, e.g., the layers 114, 115, 116 and 117, are essentially a volume of material, each of which contribute a portion of the germanium that will be present in the final homogeneous SiGe semiconductor material 122 after the mixing thermal anneal process is performed.

In one embodiment, the process operation 120 may be a fin condensation thermal anneal process. In one illustrative embodiment, the fin condensation thermal anneal process may be performed at a temperature that falls within the range of about 500-1100° C. using an RTA furnace, a laser anneal process or a traditional furnace, depending upon the particular application. The fin condensation thermal anneal process must be performed in an oxidizing processing ambient. During the fin condensation thermal anneal process, some of the outer portions of the overall fin structure are oxidized, thereby producing a thinner, more condensed homogeneous SiGe semiconductor material 122.

Figure 2F:
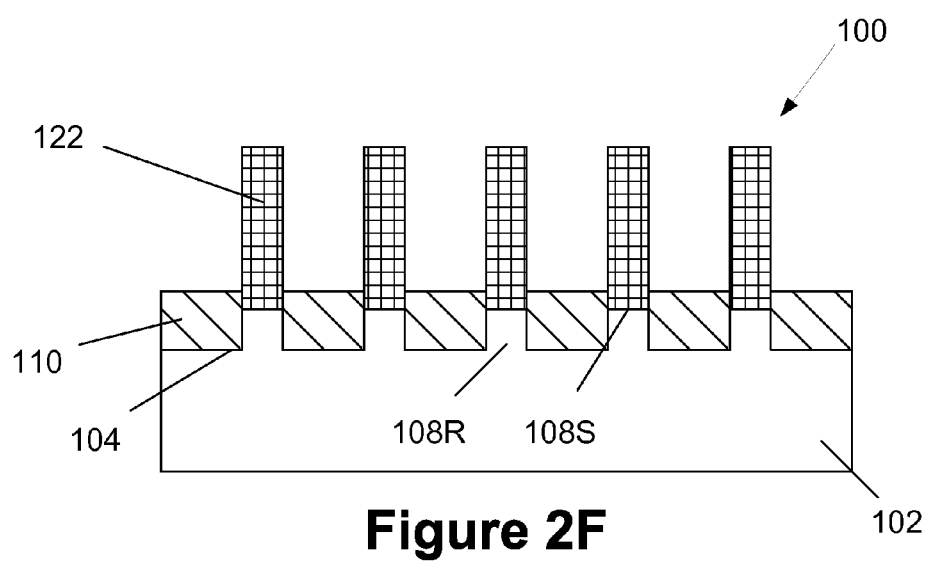

FIG. 2F depicts the device 100 after a recess etching process was performed on the layer of insulating material 110 so as to reveal the desired height of the homogeneous SiGe semiconductor material 122.

Figure 2G:
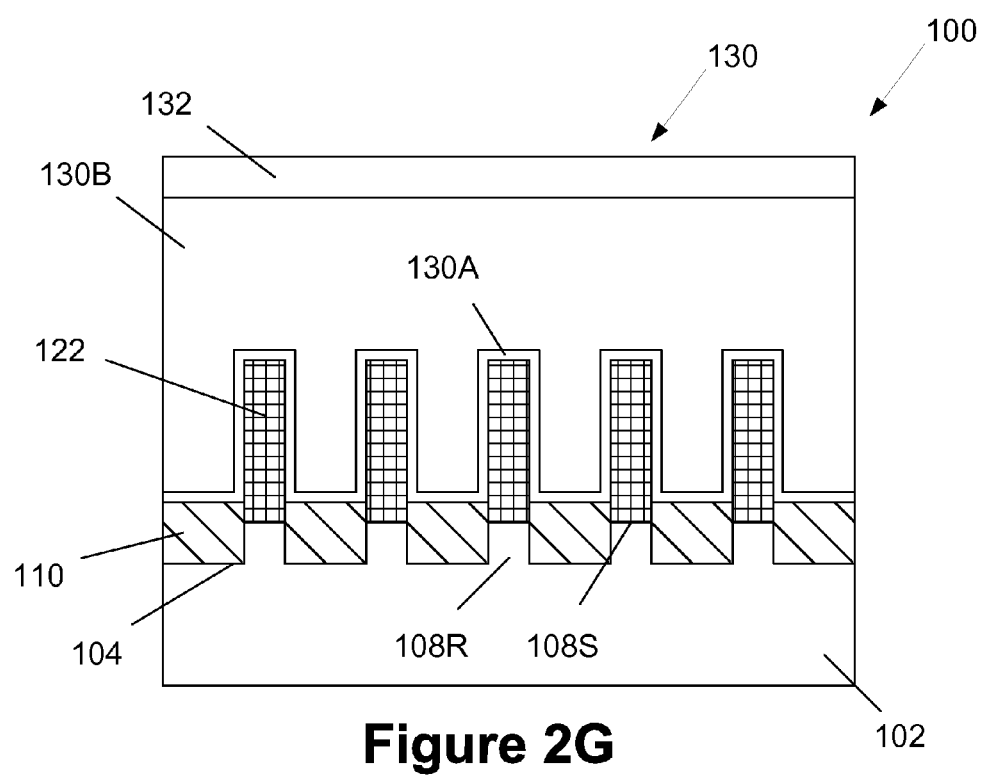

FIG. 2G depicts the device 100 after an illustrative and schematically depicted gate structure 130 and gate cap layer 132 were formed around the channel region of the device 100 using well-known techniques. In one illustrative embodiment, the schematically depicted gate structure 130 includes an illustrative gate insulation layer 130A and an illustrative gate electrode 130B. The gate structure 130 may be formed using so-called gate-first or replacement gate techniques. The gate insulation layer 130A may be comprised of a variety of different materials, such as, for example, a so-called high-k (k value greater than 10) insulation material (where k is the relative dielectric constant), etc. Similarly, the gate electrode 130B of the gate structure 130 may be comprised of polysilicon or one or more metal layers that act as the gate electrode. As will be recognized by those skilled in the art after a complete reading of the present application, the gate structure 130 of the device 100 depicted in the drawings, i.e., the gate insulation layer and the gate electrode, is intended to be representative in nature. That is, the gate structure 130 may be comprised of a variety of different materials and it may have a variety of configurations.

At the point of fabrication depicted in FIG. 2G, traditional manufacturing techniques may be performed to complete the manufacture of the device 100. For example, additional contacts and metallization layers may be formed above the device 100 using traditional techniques.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required.

Accordingly, the protection sought herein is as set forth in the claims below.

What is claimed:

1. A method, comprising:
    forming an initial fin structure in a semiconductor substrate;
    forming a layer of insulating material around said initial fin structure;
    performing a recess etching process to recess said initial fin structure and thereby define a recessed fin structure and a replacement fin cavity in said layer of insulating material above said recessed fin structure;
    forming at least first and second individual layers of epi semiconductor material in said replacement fin cavity, wherein each of said first and second layers have different concentrations of germanium;
    performing an anneal process on said first and second layers so as to form a substantially homogeneous SiGe replacement fin in said fin cavity;
    recessing said layer of insulating material so as to thereby expose at least an upper portion of said replacement fin; and
    forming a gate structure around at least a portion of said replacement fin exposed above said recessed layer of insulating material.

2. The method of claim 1, wherein said first layer is formed on said recessed fin structure and said second layer is formed on said first layer.

3. The method of claim 1, wherein said first and second layers substantially fill said replacement fin cavity.

4. The method of claim 1, further comprising forming third and fourth individual layers of epi semiconductor material in said replacement fin cavity above said second layer, wherein said third and fourth layers have different concentrations of germanium.

5. The method of claim 1, wherein said recessed fin structure is made of silicon, said first layer is made of epi silicon germanium ($Si_{(1-x)}Ge_x$), where "x" is greater than zero but less than 1, and said second layer is made of epi silicon.

6. The method of claim 1, wherein said recessed fin structure is made of silicon, said first layer is made of epi silicon germanium ($Si_{(1-x)}Ge_x$), where "x" is greater than zero but less than 1, and said second layer is made of epi silicon germanium ($Si_{(1-x)}Ge_x$), where "x" is greater than zero but less than 1.

7. The method of claim 1, wherein said recessed fin structure is made of silicon, said first layer is made of substantially pure epi germanium (Ge) and said second layer is made of epi silicon germanium ($Si_{(1-x)}Ge_x$), where "x" is greater than zero but less than 1.

8. The method of claim 1, wherein, after performing said anneal process, a germanium concentration in said substantially homogeneous SiGe replacement fin is intermediate said different concentrations of germanium in said first and second layers.

9. The method of claim 1, wherein said first and second layers are formed to the same thickness.

10. The method of claim 1, wherein said first and second layers are formed to different thicknesses.

11. The method of claim 1, wherein performing said anneal process comprises performing a mixing thermal anneal process at a temperature that falls within the range of 700-1100° C.

12. The method of claim 1, wherein performing said anneal process comprises performing a condensation anneal process in an oxidizing process ambient at a temperature that falls within the range of 500-1100° C.

13. The method of claim 1, where one of said first and second layers is substantially pure germanium or substantially pure silicon.

14. The method of claim 1, wherein said substantially homogeneous SiGe replacement fin is substantially defect-free.

15. The method of claim 1, wherein each of said at least first and second individual layers of epi semiconductor material are formed to a thickness that is less than a critical thickness for such epi semiconductor material.

16. A method, comprising:
    forming an initial fin structure in a silicon substrate;
    forming a layer of insulating material around said initial fin structure;
    performing a recess etching process to recess said initial fin structure and thereby define a recessed fin structure and a replacement fin cavity in said layer of insulating material above said recessed fin structure;
    forming at least first and second individual layers of epi SiGe semiconductor material in said replacement fin cavity, wherein each of said first and second layers have different concentrations of germanium;
    performing a mixing thermal anneal process at a temperature that falls within the range of 700-1100° C. on said first and second layers so as to form a substantially homogeneous SiGe replacement fin in said fin cavity;
    recessing said layer of insulating material so as to thereby expose at least an upper portion of said replacement fin; and
    forming a gate structure around at least a portion of said replacement fin exposed above said recessed layer of insulating material.

17. The method of claim 16, further comprising forming third and fourth individual layers of epi semiconductor material in said replacement fin cavity above said second layer, wherein said third and fourth layers have different concentrations of germanium.

18. The method of claim 16, wherein, after performing said anneal process, a germanium concentration in said substantially homogeneous SiGe replacement fin is intermediate said different concentrations of germanium in said first and second layers.

19. The method of claim 16, wherein said substantially homogeneous SiGe replacement fin is substantially defect-free.

20. The method of claim 16, wherein each of said at least first and second individual layers of epi SiGe semiconductor material are formed to a thickness that is less than a critical thickness for such epi SiGe semiconductor material.

21. A method, comprising:
    forming an initial fin structure in a silicon substrate;
    forming a layer of insulating material around said initial fin structure;
    performing a recess etching process to recess said initial fin structure and thereby define a recessed fin structure and a replacement fin cavity in said layer of insulating material above said recessed fin structure;
    forming at least first and second individual layers of epi SiGe semiconductor material in said replacement fin cavity, wherein each of said first and second layers have different concentrations of germanium;

performing a condensation anneal process in an oxidizing process ambient at a temperature that falls within the range of 500-1100° C. on said first and second layers so as to form a substantially homogeneous SiGe replacement fin in said fin cavity;

recessing said layer of insulating material so as to thereby expose at least an upper portion of said replacement fin; and forming a gate structure around at least a portion of said replacement fin exposed above said recessed layer of insulating material.

22. The method of claim 21, further comprising forming third and fourth individual layers of epi semiconductor material in said replacement fin cavity above said second layer, wherein said third and fourth layers have different concentrations of germanium.

23. The method of claim 21, wherein, after performing said anneal process, a germanium concentration in said substantially homogeneous SiGe replacement fin is intermediate said different concentrations of germanium in said first and second layers.

24. The method of claim 21, wherein said substantially homogeneous SiGe replacement fin is substantially defect-free.

25. The method of claim 21, wherein each of said at least first and second individual layers of epi SiGe semiconductor material are formed to a thickness that is less than a critical thickness for such epi SiGe semiconductor material.

* * * * *